US012622332B2

(12) United States Patent
Chen et al.

(10) Patent No.: US 12,622,332 B2
(45) Date of Patent: May 5, 2026

(54) SEMICONDUCTOR PACKAGE USING SUBSTRATE BLOCK INTEGRATION

(71) Applicant: MEDIATEK INC., Hsin-Chu (TW)

(72) Inventors: Wei-Chih Chen, Hsinchu (TW); Shi-Bai Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 377 days.

(21) Appl. No.: 18/216,561

(22) Filed: Jun. 29, 2023

(65) Prior Publication Data

US 2024/0038648 A1 Feb. 1, 2024

Related U.S. Application Data

(60) Provisional application No. 63/369,979, filed on Aug. 1, 2022.

(51) Int. Cl.
*H01L 23/498* (2006.01)
*H01L 23/00* (2006.01)

(52) U.S. Cl.
CPC .. *H01L 23/49833* (2013.01); *H01L 23/49816* (2013.01); *H01L 23/49838* (2013.01); *H01L 24/13* (2013.01); *H01L 24/16* (2013.01); *H01L 2224/13147* (2013.01); *H01L 2224/16225* (2013.01)

(58) Field of Classification Search
CPC ................................................ H01L 23/49833
See application file for complete search history.

(56) References Cited

U.S. PATENT DOCUMENTS

2021/0111141 A1* 4/2021 Sauter ..................... H01L 24/29
2021/0159211 A1 5/2021 Rubin

FOREIGN PATENT DOCUMENTS

WO 2013/095544 A1 6/2013

* cited by examiner

*Primary Examiner* — William A Harriston
(74) *Attorney, Agent, or Firm* — Winston Hsu

(57) ABSTRACT

A semiconductor package includes a partitioned package substrate that is composed of multiple discrete substrates arranged in a side-by-side manner. The discrete substrates include a central substrate and peripheral substrates surrounding the central substrate. At least one integrated circuit die is mounted on a first surface of the partitioned package substrate. A plurality of solder balls is mounted on a second surface of the partitioned package substrate opposite to the first surface.

24 Claims, 4 Drawing Sheets

SEMICONDUCTOR PACKAGE USING SUBSTRATE BLOCK INTEGRATION

CROSS REFERENCE TO RELATED APPLICATIONS

This application claims the benefit of U.S. Provisional Application No. 63/369,979, filed on Aug. 1, 2022. The content of the application is incorporated herein by reference.

BACKGROUND

The present disclosure relates generally to the field of semiconductor packaging. More particularly, the present disclosure relates to a cost-effective, large-die semiconductor package using substrate block integration (SBI).

As more consumers embrace smart devices, demand grows for networking data centers, Internet of Things, smart sensors, etc. To meet these needs, semiconductor design companies are encountering challenges in chip design complexity and PPA (power, performance, area) factors in lower geometries, such as 7 nm, 5 nm, and 3 nm.

Advanced packaging is playing a bigger role across the semiconductor industry. Networking equipment, servers, and smartphones are among the applications that have adopted advanced packaging. To advance a design, IC vendors develop an ASIC. Then, vendors will shrink different functions at each node and pack them onto the ASIC. But this approach is becoming more complex and expensive at each node.

For example, an ASIC for switch routers or data centers may include a large die and the size of the package may typically exceed 4500 mm$^2$, which leads to a rising cost of the ASIC package because of the low production yield of the package substrate at this size. The ASIC package with large die also encounters warpage problems.

SUMMARY

It is one object of the present disclosure to provide an improved large-die semiconductor package using substrate block integration (SBI) in order to solve the prior art shortcomings or deficiencies.

One aspect of the invention provides a semiconductor package including a partitioned package substrate composed of discrete substrates arranged in a side-by-side manner. The discrete substrates comprise a central substrate and peripheral substrates surrounding the central substrate. At least one integrated circuit die is mounted on a first surface of the partitioned package substrate. A plurality of solder balls is mounted on a second surface of the partitioned package substrate opposite to the first surface.

According to some embodiments, the at least one integrated circuit die is electrically connected to the partitioned package substrate through a plurality of conductive elements.

According to some embodiments, the conductive elements comprise micro-bumps, copper bumps or copper pillars.

According to some embodiments, the discrete substrates are physically separated from one another.

According to some embodiments, the discrete substrates are rearranged and adjoined together with a gap therebetween.

According to some embodiments, the discrete substrates are adjoined together by using an adhesive that fills into the gap.

According to some embodiments, the gap has a width ranging between 1-3 mm.

According to some embodiments, the discrete substrates are homogeneous substrates.

According to some embodiments, the discrete substrates are heterogeneous substrates.

According to some embodiments, the discrete substrates have the same thickness.

According to some embodiments, the discrete substrates have different thicknesses.

According to some embodiments, the semiconductor package further includes at least one die mounted on the first surface of the partitioned package substrate in a flip-chip manner.

According to some embodiments, the at least one die is a dummy die.

According to some embodiments, the at least one die is a memory die.

According to some embodiments, the semiconductor package further includes a second integrated circuit die; and an electronic device mounted on the first surface of the partitioned package substrate.

According to some embodiments, the electronic device comprises a decoupling capacitor.

According to some embodiments, the second integrated circuit die and the electronic device do not overlap with the gap.

According to some embodiments, the semiconductor package further includes an annular frame mounted on the first surface of the partitioned package substrate.

According to some embodiments, the annular frame is a metal frame.

According to some embodiments, the annular frame is attached to the first surface of the partitioned package substrate by using joint bumps.

According to some embodiments, the annular frame is attached to the first surface of the partitioned package substrate by using adhesive.

According to some embodiments, the annular frame comprise an opening for accommodating the at least one integrated circuit die.

According to some embodiments, the semiconductor package further includes a mold cap encapsulating the at least one integrated circuit die and the annular frame.

According to some embodiments, the semiconductor package further includes a re-distribution layer (RDL) structure on the first surface of the partitioned package substrate, wherein the at least one integrated circuit die is mounted on the RDL structure.

According to some embodiments, the central substrate is a silicon substrate and comprises passive circuit elements including integrated passive devices or deep trench capacitors.

According to some embodiments, the central substrate is a ceramic substrate and comprises multi-layer ceramic capacitors.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
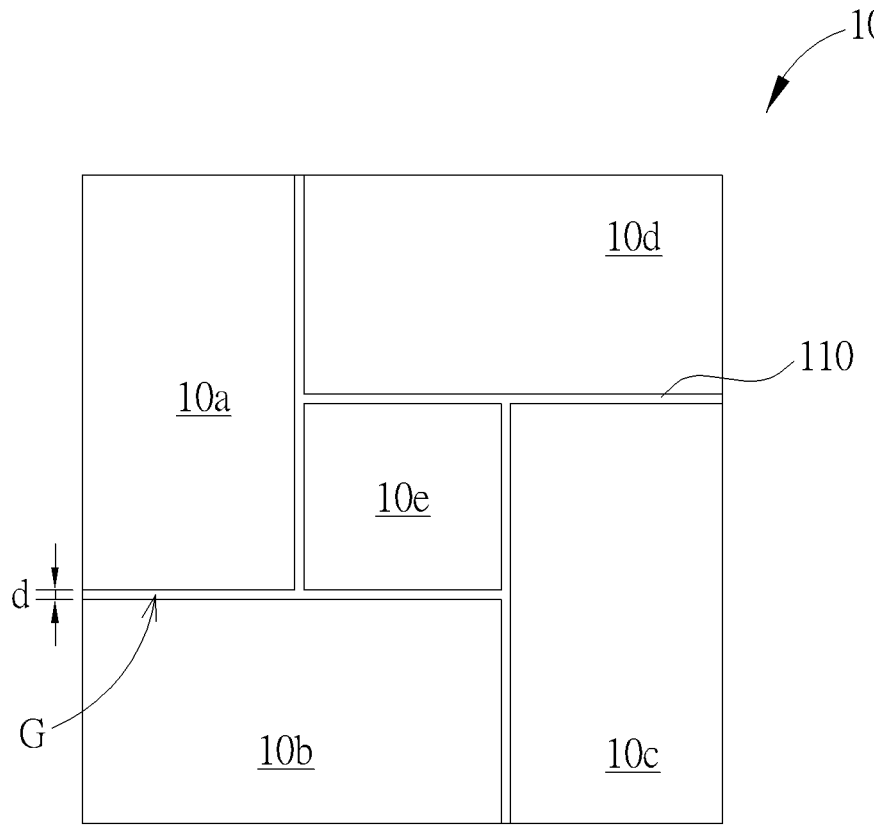
FIG. 1 is a schematic diagram showing an exemplary partitioned package substrate in accordance with an embodiment of the invention.

Please refer to FIG. 1. FIG. 1 is a schematic diagram showing an exemplary partitioned package substrate in accordance with an embodiment of the invention. As shown in FIG. 1, the partitioned package substrate 10 is composed of at least two smaller substrates (or smaller substrate blocks) arranged in a side-by-side manner. For example, five coplanar small substrates 10a-10e are demonstrated in FIG. 1. It is to be understood that the number and shape of the substrates 10a-10e are for illustration purposes only. According to an embodiment, the partitioned package substrate 10 may have a square shape and a dimension of, for example, between 60 mm×60 mm and 70 mm×70 mm.

According to an embodiment of the invention, the five small substrates 10a-10e are physically separated from one another. The five discrete substrates 10a-10e include a central substrate 10e and four rectangular shaped peripheral substrates 10a-10d surrounding the central substrate 10e. The central substrate 10e is surrounded by the four substrates 10a-10d. According to an embodiment, for example, each of the four small substrates 10a-10d may have a rectangular shape and a dimension of about 20 mm×40 mm. According to an embodiment, for example, the central substrate 10e may have a square shape and a dimension of about 20 mm×20 mm.

According to an embodiment of the invention, the five small substrates 10a-10e are rearranged and adjoined together with a gap G therebetween. According to an embodiment of the invention, for example, the four small substrates 10a-10d may be adjoined or glued together side-by-side by using a gap-filling material 110 such as an adhesive or a molding compound that fills into the gap G. According to an embodiment of the invention, for example, the gap G may have a width d ranging between 1-3 mm.

According to an embodiment of the invention, the five small substrates 10a-10e may be homogeneous substrates. For example, the five small substrates 10a-10e may be composed of substantially the same substrate materials such as BT substrates or ABF substrates. According to another embodiment of the invention, the five small substrates 10a-10e may be heterogeneous substrates. For example, the five small substrates 10a-10e may be composed of different substrate materials such as glass substrates, ceramic substrates, BT substrates, ABF substrates, etc. According to an embodiment of the invention, the central substrate 10e may be a silicon substrate and may comprise a plurality of passive circuit elements including, but not limited to, integrated passive devices and/or deep trench capacitors. According to an embodiment of the invention, the central substrate 10e may be a ceramic substrate and may comprise a plurality of multi-layer ceramic capacitors (MLCC).

According to an embodiment of the invention, the five small substrates 10a-10e may have substantially the same thickness. According to an embodiment of the invention, the five small substrates 10a-10e may have different thicknesses.

Figure 2A:
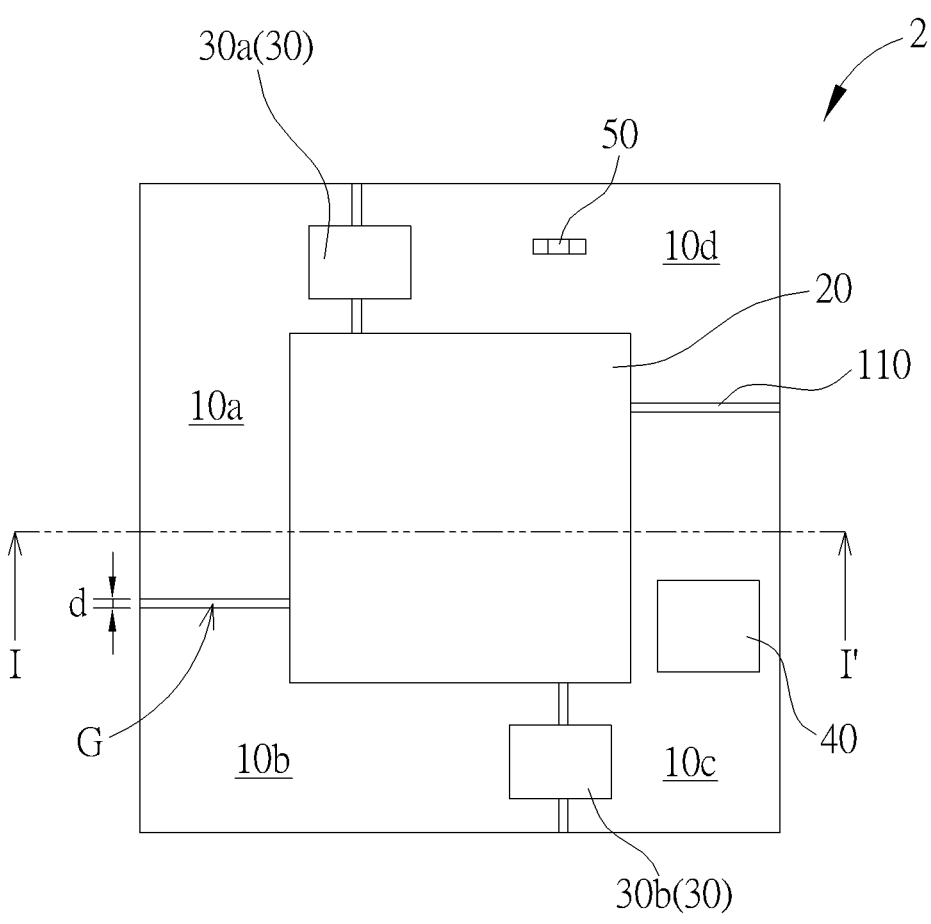
FIG. 2A is a schematic diagram showing an exemplary semiconductor package in accordance with an embodiment of the invention.
Figure 2B:
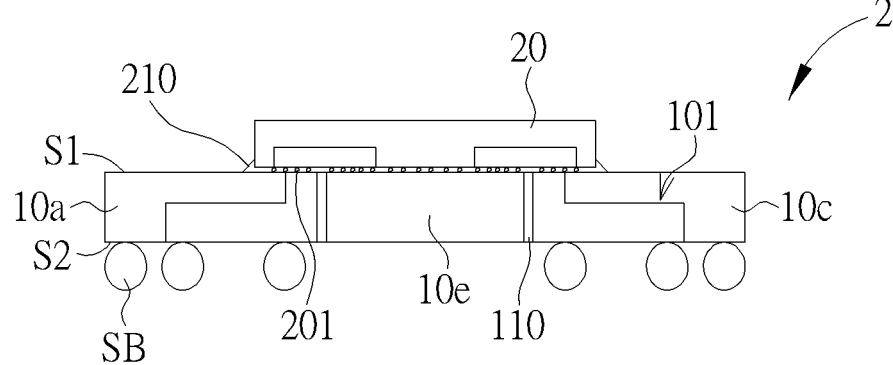
FIG. 2B is a cross-sectional view taken along line I-I' in FIG. 2A.

Please refer to FIG. 2A and FIG. 2B. FIG. 2A is a schematic diagram showing an exemplary semiconductor package in accordance with an embodiment of the invention. FIG. 2B is a cross-sectional view taken along line I-I' in FIG. 2A. As shown in FIG. 2A and FIG. 2B, the semiconductor package 1 comprises a partitioned package substrate 10 as set forth in FIG. 1 and at least one integrated circuit die 20 mounted on a first surface S1 of the partitioned package substrate 10. According to an embodiment, the first surface S1 of the partitioned package substrate 10 is a flat surface. According to an embodiment, for example, the at least one integrated circuit die 20 may be mounted on the first surface S1 of the partitioned package substrate 10 in a flip-chip manner. According to an embodiment, the at least one integrated circuit die 20 is electrically connected to the partitioned package substrate 10 through a plurality of conductive elements 201 such as micro-bumps, copper bumps or copper pillars, but is not limited thereto. An underfill 210 may be filled into a space between the at least one integrated circuit die 20 and the first surface S1 of the partitioned package substrate 10. According to an embodiment, the partitioned package substrate 10 may have a square shape and a dimension of, for example, between 60 mm×60 mm and 70 mm×70 mm.

According to an embodiment of the invention, the partitioned package substrate 10 is composed of at least two smaller substrates (or smaller substrate blocks), for example, five coplanar small substrates 10a-10e, arranged in a side-by-side manner. It is to be understood that the number and shape of the substrates 10a-10d are for illustration purposes only. According to an embodiment of the invention, the central substrate 10e, which may comprise a plurality of passive circuit elements including, but not limited to, integrated passive devices and/or deep trench capacitors, is situated directly under the at least one integrated circuit die 20.

According to an embodiment of the invention, the five small substrates 10a-10e are physically separated from one another. According to an embodiment, each of the four small substrates 10a-10d may have a rectangular shape and a dimension of, for example, 20 mm×40 mm. According to an embodiment, for example, the central substrate 10e may have a square shape and a dimension of about 20 mm×20 mm.

According to an embodiment of the invention, the four small substrates 10a-10d are rearranged and adjoined together with a gap G therebetween. According to an embodiment of the invention, for example, the four small substrates 10a-10d may be adjoined or glued together side-by-side by using a gap-filling material 110 such as an adhesive or a molding compound that fills into the gap G. According to an embodiment of the invention, for example, the width d of the gap G may range between 1-3 mm.

According to an embodiment of the invention, the five small substrates 10a-10e may be homogeneous substrates. For example, the five small substrates 10a-10e may be composed of substantially the same substrate materials such as BT substrates or ABF substrates. According to another embodiment of the invention, the five small substrates 10a-10e may be heterogeneous substrates. For example, the five small substrates 10a-10e may be composed of substrate materials different from one another. For example, the four small substrates 10a-10d may be composed of the same substrate material such as plastic or polymer, while the central substrate 10e is composed of a different substrate material such as silicon or ceramic. According to an embodiment of the invention, the five small substrates 10a-10e may have substantially the same thickness. According to an embodiment of the invention, the five small substrates 10a-10e may have different thicknesses.

According to an embodiment of the invention, at least one of the five small substrates 10a-10e may comprise an interconnect structure 101 for electrically connecting the integrated circuit die 20 to the respective solder balls SB mounted on a second surface S2 of the partitioned package substrate 10. According to an embodiment of the invention, the interconnect structures 101 of the five small substrates 10a-10e may be the same as or similar to one another. According to an embodiment of the invention, the interconnect structures 101 of the five small substrates 10a-10e may be different from one another.

According to an embodiment of the invention, the semiconductor package 1 may further comprise at least one die 30 mounted on the first surface S1 of the partitioned package substrate 10 in a flip-chip manner. According to an embodiment of the invention, the die 30 may overlap with at least two of the four small substrates 10a-10d. For example, in FIG. 2A, a die 30a is disposed between the small substrates 10a and 10d, and a die 30b is disposed between the small substrates 10b and 10c. According to an embodiment of the invention, the die 30 may be a dummy die that contains no active integrated circuit elements. The dummy die is used to bridge or interconnect the two adjacent small substrates. According to another embodiment of the invention, the die 30 may comprise a memory die such as a high bandwidth memory (HBM) die.

According to some embodiments, the semiconductor package 1 may further comprise an integrated circuit die 40 and an electronic device 50 such as a decoupling capacitor, an inductor, or a resistor mounted on the first surface S1 of the partitioned package substrate 10. The integrated circuit die 40 and the electronic device 50 may not overlap with the gap G.

By adopting smaller substrates, the reliability and the design flexibility of the semiconductor package structure can be improved and the production cost can be reduced. The partitioned package substrate 10 also improves the package warpage issues.

Figure 3A:
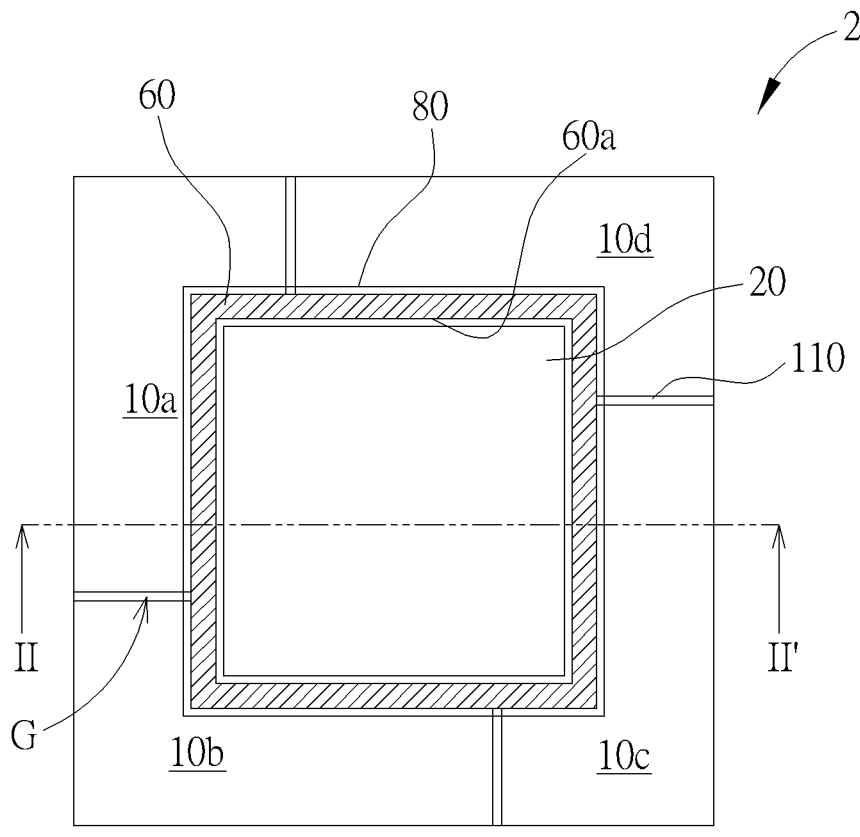
FIG. 3A is a schematic diagram showing an exemplary semiconductor package in accordance with another embodiment of the invention.
Figure 3B:
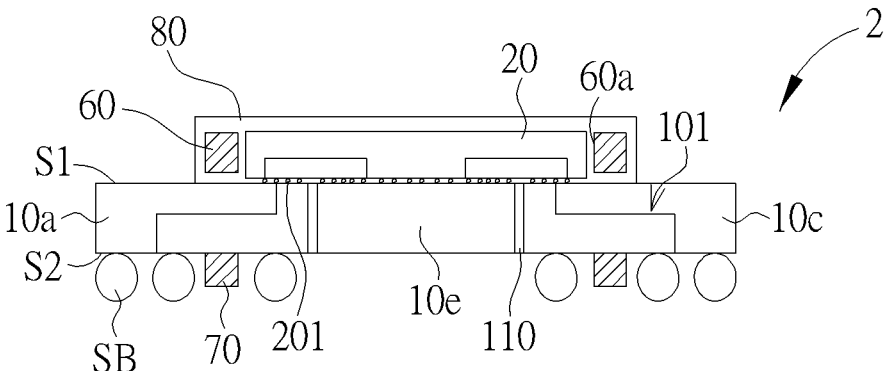
FIG. 3B is a cross-sectional view taken along line II-II' in FIG. 3A.

Please refer to FIG. 3A and FIG. 3B. FIG. 3A is a schematic diagram showing an exemplary semiconductor package in accordance with another embodiment of the invention, wherein like regions, layers or elements are designated by like numeral numbers or labels. FIG. 3B is a cross-sectional view taken along line II-II' in FIG. 3A. As shown in FIG. 3A and FIG. 3B, likewise, the semiconductor package 2 comprises a partitioned package substrate 10 and at least one integrated circuit die 20 mounted on a first surface S1 of the partitioned package substrate 10. According to an embodiment, the first surface S1 of the partitioned package substrate 10 is a flat surface. According to an embodiment, for example, the at least one integrated circuit die 20 may be mounted on the first surface S1 of the partitioned package substrate 10 in a flip-chip manner. According to an embodiment, the at least one integrated circuit die 20 is electrically connected to the partitioned package substrate 10 through a plurality of conductive elements 201 such as micro-bumps, copper bumps or copper pillars, but is not limited thereto. According to an embodiment, the partitioned package substrate 10 may have a square shape and a dimension of, for example, between 60 mm×60 mm and 70 mm×70 mm.

According to an embodiment of the invention, the partitioned package substrate 10 is composed of at least two smaller substrates, for example, five coplanar small substrates 10a-10e, arranged in a side-by-side manner. It is to be understood that the number and shape of the substrates 10a-10d are for illustration purposes only. According to an embodiment of the invention, the central substrate 10e, which may comprise a plurality of passive circuit elements including, but not limited to, integrated passive devices and/or deep trench capacitors, is situated directly under the at least one integrated circuit die 20.

According to an embodiment of the invention, the five small substrates 10a-10e are physically separated from one another. According to an embodiment, each of the four small substrates 10a-10d may have a rectangular shape and a dimension of, for example, between 20 mm×40 mm. According to an embodiment, the central substrate 10e may have a square shape and a dimension of, for example, between 20 mm×20 mm. According to an embodiment of the invention, the five small substrates 10a-10e are rearranged and adjoined together with a gap G therebetween. According to an embodiment of the invention, for example, the five small substrates 10a-10e may be adjoined or glued together side-by-side by using a gap-filling material 110 such as an adhesive or a molding compound that fills into the gap G. According to an embodiment of the invention, for example, the width d of the gap G may range between 1-3 mm.

According to an embodiment of the invention, the five small substrates 10a-10e may be homogeneous substrates. For example, the five small substrates 10a-10e may be composed of substantially the same substrate materials such as BT substrates or ABF substrates. According to another embodiment of the invention, the five small substrates 10a-10e may be heterogeneous substrates. For example, the five small substrates 10a-10e may be composed of substrate materials different from one another. For example, the four small substrates 10*a*-10*d* may be composed of the same substrate material such as plastic or polymer, while the central substrate 10*e* is composed of a different substrate material such as silicon or ceramic. According to an embodiment of the invention, the five small substrates 10*a*-10*e* may have substantially the same thickness. According to an embodiment of the invention, the five small substrates 10*a*-10*e* may have different thicknesses.

According to an embodiment of the invention, at least one of the five small substrates 10*a*-10*e* may comprise an interconnect structure 101 for electrically connecting the integrated circuit die 20 to the respective solder balls SB mounted on a second surface S2 of the partitioned package substrate 10. According to an embodiment of the invention, the interconnect structures 101 of the five small substrates 10*a*-10*e* may be the same as or similar to one another. According to an embodiment of the invention, the interconnect structures 101 of the five small substrates 10*a*-10*e* may be different from one another.

According to an embodiment of the invention, the semiconductor package 2 may further comprise an annular frame 60 mounted on the first surface S1 of the partitioned package substrate 10. According to another embodiment of the invention, optionally, the semiconductor package 2 may further comprise an annular frame 70 mounted on the second surface S2 of the partitioned package substrate 10. According to an embodiment of the invention, the frames 60 and 70 may be a metal frame, but is not limited thereto. According to an embodiment of the invention, the frames 60 and 70 may be attached to the partitioned package substrate 10 by using joint bumps. According to some embodiments, the frames 60 and 70 may be attached to the partitioned package substrate 10 by using an adhesive. The frame 60 may comprise an opening 60*a* for accommodating the integrated circuit die 20. The integrated circuit die 20 may be surrounded by the frame 60. According to an embodiment of the invention, the semiconductor package 2 may further a mold cap 80. According to an embodiment of the invention, the mold cap 80 encapsulates the annular frame 60 and the at least one integrated circuit die 20.

Figure 4:
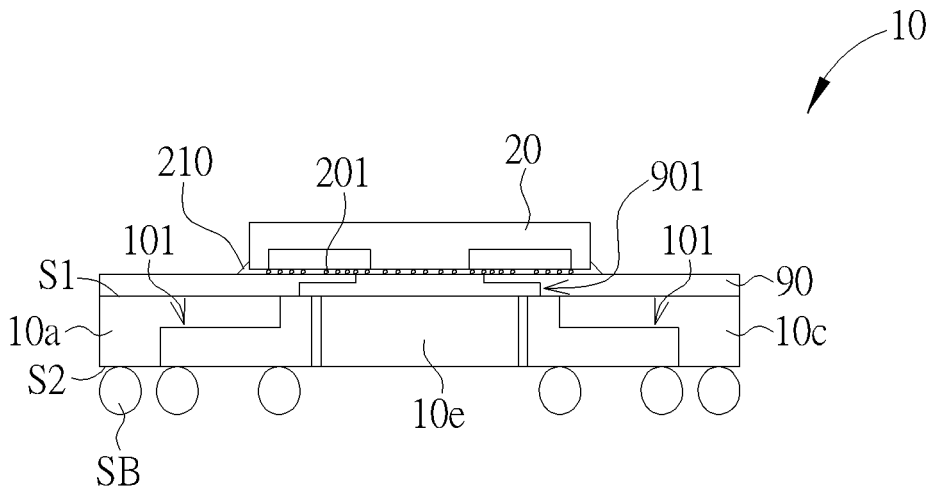
FIG. 4 is a schematic, cross-sectional diagram showing another embodiment of the invention.

Please refer to FIG. 4. FIG. 4 is a schematic, cross-sectional diagram showing another embodiment of the invention. As shown in FIG. 4, a re-distribution layer (RDL) structure 90 may be disposed on the first surface S1 of the partitioned package substrate 10. According to an embodiment of the invention, the RDL structure 90 comprises interconnect 901. The integrated circuit die 20 is mounted on the RDL structure 90. The integrated circuit die 20 is electrically connected to the respective solder balls SB mounted on a second surface S2 of the partitioned package substrate 10 through the RDL structure 90 and the partitioned package substrate 10.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a partitioned package substrate composed of a plurality of discrete substrates arranged in a side-by-side manner, wherein the plurality of discrete substrates comprises a central substrate and peripheral substrates surrounding the central substrate, wherein the plurality of discrete substrates are rearranged and adjoined together with a gap therebetween, and wherein the plurality of discrete substrates are adjoined together by using an adhesive that fills into the gap;
at least one integrated circuit die mounted on a first surface of the partitioned package substrate; and
a plurality of solder balls mounted on a second surface of the partitioned package substrate opposite to the first surface.

2. The semiconductor package according to claim 1, wherein the at least one integrated circuit die is electrically connected to the partitioned package substrate through a plurality of conductive elements.

3. The semiconductor package according to claim 2, wherein the conductive elements comprise micro-bumps, copper bumps or copper pillars.

4. The semiconductor package according to claim 1, wherein the plurality of discrete substrates are physically separated from one another.

5. The semiconductor package according to claim 1, wherein the gap has a width ranging between 1-3 mm.

6. The semiconductor package according to claim 1, wherein the plurality of discrete substrates are homogeneous substrates.

7. The semiconductor package according to claim 1, wherein the plurality of discrete substrates are heterogeneous substrates.

8. The semiconductor package according to claim 1, wherein the plurality of discrete substrates have the same thickness.

9. The semiconductor package according to claim 1, wherein the plurality of discrete substrates have different thicknesses.

10. The semiconductor package according to claim 1 further comprising:
at least one die mounted on the first surface of the partitioned package substrate in a flip-chip manner.

11. The semiconductor package according to claim 10, wherein the at least one die is a dummy die.

12. The semiconductor package according to claim 10, wherein the at least one die is a memory die.

13. The semiconductor package according to claim 1 further comprising:
a second integrated circuit die; and
an electronic device mounted on the first surface of the partitioned package substrate.

14. The semiconductor package according to claim 13, wherein the electronic device comprises a decoupling capacitor.

15. The semiconductor package according to claim 13, wherein the second integrated circuit die and the electronic device do not overlap with the gap.

16. The semiconductor package according to claim 1 further comprising:
an annular frame mounted on the first surface of the partitioned package substrate.

17. The semiconductor package according to claim 16, wherein the annular frame is a metal frame.

18. The semiconductor package according to claim 16, wherein the annular frame is attached to the first surface of the partitioned package substrate by using joint bumps.

19. The semiconductor package according to claim 16, wherein the annular frame is attached to the first surface of the partitioned package substrate by using adhesive.

20. The semiconductor package according to claim 16, wherein the annular frame comprise an opening for accommodating the at least one integrated circuit die.

21. The semiconductor package according to claim 16 further comprising:

a mold cap encapsulating the at least one integrated circuit die and the annular frame.

22. The semiconductor package according to claim 1 further comprising:

a re-distribution layer (RDL) structure on the first surface of the partitioned package substrate, wherein the at least one integrated circuit die is mounted on the RDL structure.

23. The semiconductor package according to claim 1, wherein the central substrate is a silicon substrate and comprises a plurality of passive circuit elements comprising integrated passive devices or deep trench capacitors.

24. The semiconductor package according to claim 1, wherein the central substrate is a ceramic substrate and comprises a plurality of multi-layer ceramic capacitors.

\* \* \* \* \*